United States Patent
Kojima

(10) Patent No.: US 6,603,702 B2
(45) Date of Patent: Aug. 5, 2003

(54) SEMICONDUCTOR INTEGRATED CIRCUIT

(75) Inventor: Makoto Kojima, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 13 days.

(21) Appl. No.: 09/791,568

(22) Filed: Feb. 26, 2001

(65) Prior Publication Data

US 2001/0020840 A1 Sep. 13, 2001

(30) Foreign Application Priority Data

Mar. 1, 2000 (JP) ........................ 2000-055106

(51) Int. Cl.[7] ................... G11C 8/00; G11C 16/04; G11C 16/06
(52) U.S. Cl. .................. 365/230.06; 365/185.11; 365/185.18; 365/185.19; 365/185.28; 365/185.23
(58) Field of Search .................. 365/185.11, 185.18, 365/189.19, 185.28, 185.23, 230.06

(56) References Cited

U.S. PATENT DOCUMENTS

| | | | | |
|---|---|---|---|---|
| 4,642,491 A | * | 2/1987 | Kenney et al. ............ | 257/361 |
| 5,148,398 A | * | 9/1992 | Kohno ..................... | 365/201 |
| 5,212,616 A | * | 5/1993 | Dhong et al. ............. | 361/18 |
| 5,450,027 A | * | 9/1995 | Gabara ..................... | 326/98 |
| 5,576,992 A | * | 11/1996 | Mehrad .................. | 365/185.24 |
| 5,587,676 A | * | 12/1996 | Chowdhury .............. | 327/108 |
| 5,594,360 A | * | 1/1997 | Wojciechowski ......... | 324/771 |
| 5,671,179 A | * | 9/1997 | Javanifard .............. | 365/185.33 |
| 5,680,349 A | * | 10/1997 | Atsumi et al. ............. | 326/108 |
| 5,689,459 A | * | 11/1997 | Chang et al. ............. | 257/321 |
| 5,784,315 A | * | 7/1998 | Itoh ....................... | 365/185.09 |
| 5,822,246 A | * | 10/1998 | Taub et al. .............. | 365/185.18 |
| 5,883,833 A | * | 3/1999 | Naura et al. ............. | 365/185.19 |
| 5,945,870 A | * | 8/1999 | Chu et al. ............... | 327/536 |
| 5,959,890 A | * | 9/1999 | Yamamoto et al. ...... | 365/185.18 |
| 6,034,895 A | * | 3/2000 | Naura et al. ............. | 365/185.19 |
| 6,038,190 A | * | 3/2000 | Kowalski et al. ......... | 365/228 |
| 6,040,994 A | * | 3/2000 | Naura .................... | 365/185.18 |
| 6,044,020 A | * | 3/2000 | Chung et al. ........... | 365/185.11 |
| 6,097,639 A | * | 8/2000 | Choi et al. .............. | 365/185.03 |
| 6,243,290 B1 | * | 6/2001 | Kurata et al. ........... | 365/185.03 |
| 6,258,668 B1 | * | 7/2001 | Lee et al. ................ | 438/257 |
| 6,272,047 B1 | * | 8/2001 | Mihnea et al. .......... | 365/185.14 |
| 6,282,145 B1 | * | 8/2001 | Tran et al. .............. | 365/230.06 |
| 2002/0024873 A1 | * | 2/2002 | Tomishima et al. ...... | 365/230.06 |

OTHER PUBLICATIONS

"A 3.3V 90MHz Flash Memory Module Embedded in a 32b RISC Microcontroller", M. Hiraki et al., 1999 ISSCC Digest of Technical Papers, pp. 116–117.

"Low Voltage, Low Current, High Speed Program Step Split Gate Cell with Ballistic Direct Injection for EEPROM/Flash", S. Ogura et al., IEDM 1998, pp. 987–990.

* cited by examiner

Primary Examiner—David Nelms
Assistant Examiner—Ly Duy Pham
(74) Attorney, Agent, or Firm—McDermott, Will & Emery

(57) ABSTRACT

In a flash memory, a level shifter and a driver of a wordline driver are formed by MOS transistors having a low sustaining voltage, and a voltage control circuit for controlling a driver power supply voltage VPP is provided. The voltage control circuit holds VPP at a voltage LV which is below the sustaining voltage, when the logical state of the MOS transistors is changed. In addition, the voltage control circuit ramps up VPP from the low-level voltage LV to a voltage HV which is above the sustaining voltage, after the logical state of the MOS transistors has been changed. Further, the voltage control circuit ramps down VPP from the high-level voltage HV to the low-level voltage LV, before the logical state of the MOS transistors is changed next. Such arrangement enables even a wordline driver of the low-level voltage specification to handle not only low-level voltage but also high-level voltage without introducing any problems.

11 Claims, 6 Drawing Sheets

SEMICONDUCTOR INTEGRATED CIRCUIT

BACKGROUND OF THE INVENTION

This invention relates to a semiconductor integrated circuit including a transistor designed to selectively provide either a low or a high voltage.

There has been the constraint imposed on the use condition of conventional MOS (metal-oxide semiconductor) transistors that the drain-source voltage Vds should not exceed a sustaining voltage Vds(sus), the reason for which is as follows. If Vds exceeds Vds(sus) when a drain-source current Ids is flowing, then avalanche breakdown occurs, resulting in a rapid increase in Id (the drain current). Vds(sus) is the voltage below the drain-source breakdown voltage BVds which is defined on the condition that the gate-source voltage Vgs is equal to 0 V. The breakdown voltage defined by Vds(sus) is called the "sustaining breakdown voltage". Further, the same sustaining breakdown voltage constraint is imposed also on bipolar transistors.

FIG. 1 shows characteristics of an N channel MOS transistor by measurements at room temperature. The gate oxide film thickness, the gate length, and the BVds of the transistor are, 8 nm, 0.4 μm, and about 7 V, respectively. As can be seen from FIG. 1, the Vds(sus) of the transistor is 4.0 V. FIG. 1 shows that if Vds increases beyond Vds(sus) when Vgs is held at, for example, 3.0 V, avalanche breakdown occurs and there is a sudden increase in Id. This phenomenon may be explained as follows. Electrons, i.e., carriers forming Ids, are accelerated by a high electric field at the drain end. The accelerated electrons generate an electron-hole pair by collision. The generated electron, accelerated with high energy, jumps into the gate oxide film. On the other hand, the generated hole is observed as a substrate current Isub superimposing Ids and there is appeared a sudden increase in Id (=Ids+Isub). Such a phenomenon is called the "hot carrier effect" which is a known cause of transistor reliability problems. Accordingly, the power supply voltage, when the transistor of FIG. 1 is used, is limited to voltage values below Vds(sus), for example, 3.3 V. Also for the case of P channel MOS transistors, the hot carrier effect more or less exists, and the same as pointed out above for the N channel MOS transistor can be applied for the P channel MOS transistor.

Apart from the above, for example, in a flash memory of the floating gate type having nonvolatile memory cells, it is required that the wordlines be driven at a low voltage and at a high voltage. M. Hiraki et al. disclose, in their paper entitled "A 3.3V 90 MHz Flash Memory Module Embedded in a 32b RISC Microcontroller", 1999 ISSCC Digest of Technical Papers, pp. 116–117, a flash memory technology in which a wordline driver of the low performance/high voltage specification for programming and erase operations is provided in addition to the provision of another wordline driver of the high performance/low voltage specification for read operations and either one of these wordline drivers is selectively used. The read wordline driver is formed of a low breakdown voltage MOS transistor whose gate oxide film is thin, whereas the programming/erase wordline driver is formed of a high breakdown voltage MOS transistor whose gate oxide film is thick.

However, the above-described conventional flash memory requires preparation of two different masks in order to realize two different gate oxide film thicknesses for the wordline drivers, therefore increasing production costs.

SUMMARY OF THE INVENTION

Accordingly, an object of the present invention is to allow even a low breakdown voltage transistor to handle not only low voltage but also high voltage without introducing any problems, in a semiconductor integrated circuit including a transistor designed to selectively provide either a low or a high voltage.

Another object of the present invention is to allow even a wordline driver of the low voltage specification to handle not only low voltage but also high voltage without introducing any problems, in a flash memory.

In order to provide a description of the concept of the inventor of the present invention, suppose here that a given power supply voltage is applied to a series circuit of an N channel MOS transistor of FIG. 1 and a P channel MOS transistor (not shown). Further suppose that the power supply voltage is above the Vds(sus) of the N channel MOS transistor. At this time, for example, if the N channel MOS transistor makes a state transition from the on state to the off state and the P channel MOS transistor makes a state transition from the off state to the on state, this may create, in the course of such state transition, a situation that there is a flow of Ids through the N channel MOS transistor and the Vds of the N channel MOS transistor exceeds Vds(sus). Under this situation, as described above, avalanche breakdown will occur and the Isub component which is a cause of the drop in reliability comes to be contained in Id. The inventor of the present invention gave attention to the fact that if Vgs is less than the threshold voltage of the N channel MOS transistor (for example, when Vgs=0 V and the N channel MOS transistor is "off"), Id does not increase even when Vds (=the power supply voltage) increases beyond Vds(sus), thereby maintaining the state that Id=0. Under this condition, Id=0, so that there are no carriers to be accelerated. Therefore, even when Vds increases beyond Vds(sus), no breakdown will occur until BVds is reached. Further, the inventor of the present invention gave attention to the following fact. That is, when Vgs is above the threshold voltage of the N channel MOS transistor (for example, when Vgs=3.0 V and the N channel MOS transistor is "on"), even if the power supply voltage increases beyond Vds(sus), most of the increased power supply voltage is applied to a load of the N channel MOS transistor (for example, the P channel MOS transistor in the off state) and the voltage that is applied between the drain and the source of the N channel MOS transistor does not increase beyond Vds(sus). Therefore, no avalanche breakdown occurs. In other words, as long as the logical state of the N channel MOS transistor is determined, no avalanche breakdown will occur even when the power supply voltage increases beyond Vds(sus). More concretely, for the case of the N channel MOS transistor of FIG. 1, since electric field application of as much as 8 MV/cm is tolerable for a short period of time, it is possible, in accordance with the present invention, to increase the power supply voltage above a voltage level above Vds(sus) (for example, about 6.4 V) in the case of employing the transistor.

From the above points to which the inventor of the present invention gave attention, the present invention provides a semiconductor integrated circuit comprising a transistor having a given sustaining voltage and a voltage control circuit for controlling a power supply voltage connected to the transistor, wherein the voltage control circuit operates to hold the power supply voltage at a voltage level below the sustaining voltage when the logical state of the transistor is changed, and operates to ramp up the power supply voltage from the voltage level below the sustaining voltage to a voltage level above the sustaining voltage after the logical state of the transistor has been changed. Moreover, before the logical state of the transistor is changed next, the voltage control circuit operates to ramp down the power supply voltage from the voltage level above the sustaining voltage to the voltage level below the sustaining voltage.

For example, when a MOS transistor is "on", the rate at which the power supply voltage ramps up is limited in such a manner that the logical state of a next-stage transistor of the MOS transistor should not be changed by a change in the drain-source voltage of the MOS transistor due to the ramping up of the power supply voltage. Additionally, for example, when a MOS transistor is "on", the rate at which the power supply voltage ramps down is limited in such a manner that a parasitic bipolar of the MOS transistor should not be turned on by a change in the drain potential of the MOS transistor due to the ramping down of the power supply voltage.

According to the present invention, in a semiconductor integrated circuit having a MOS transistor with a given sustaining voltage Vds(sus), it is possible to design the MOS transistor to selectively provide either a voltage LV which is below Vds(sus) or a voltage HV which is above Vds(sus). That is to say, when the power supply voltage is held at LV, it is possible for the MOS transistor to provide at its drain a logical signal at the level of LV by causing the MOS transistor to change from the off state to the on state, and vice versa. At this time, since the power supply voltage is held at LV which is below Vds(sus), no avalanche breakdown will occur in the MOS transistor. Moreover, in order to provide a logical signal at the level of HV from the drain of the MOS transistor, the power supply voltage is ramped up from LV to HV after the logical state of the MOS transistor is determined. Here, even if the power supply voltage is ramped up from LV to HV during the time that the MOS transistor remains in the off state, no avalanche breakdown will occur for the above reason. Further, even if the power supply voltage is ramped up from LV to HV during the time that the MOS transistor remains in the on state, no avalanche breakdown will occur because the voltage that is applied between the drain and the source of the MOS transistor does not increase beyond Vds(sus). As described above, even when the MOS transistor is a low breakdown voltage transistor, not only low voltage but also high voltage can be handled by the MOS transistor without introducing any problems.

Further, by applying the circuit technology of the present invention to wordline drivers for flash memories, even a wordline driver of the low voltage specification is allowed to handle not only low voltage but also high voltage without introducing any problems.

DETAILED DESCRIPTION OF THE INVENTION

Figure 2:
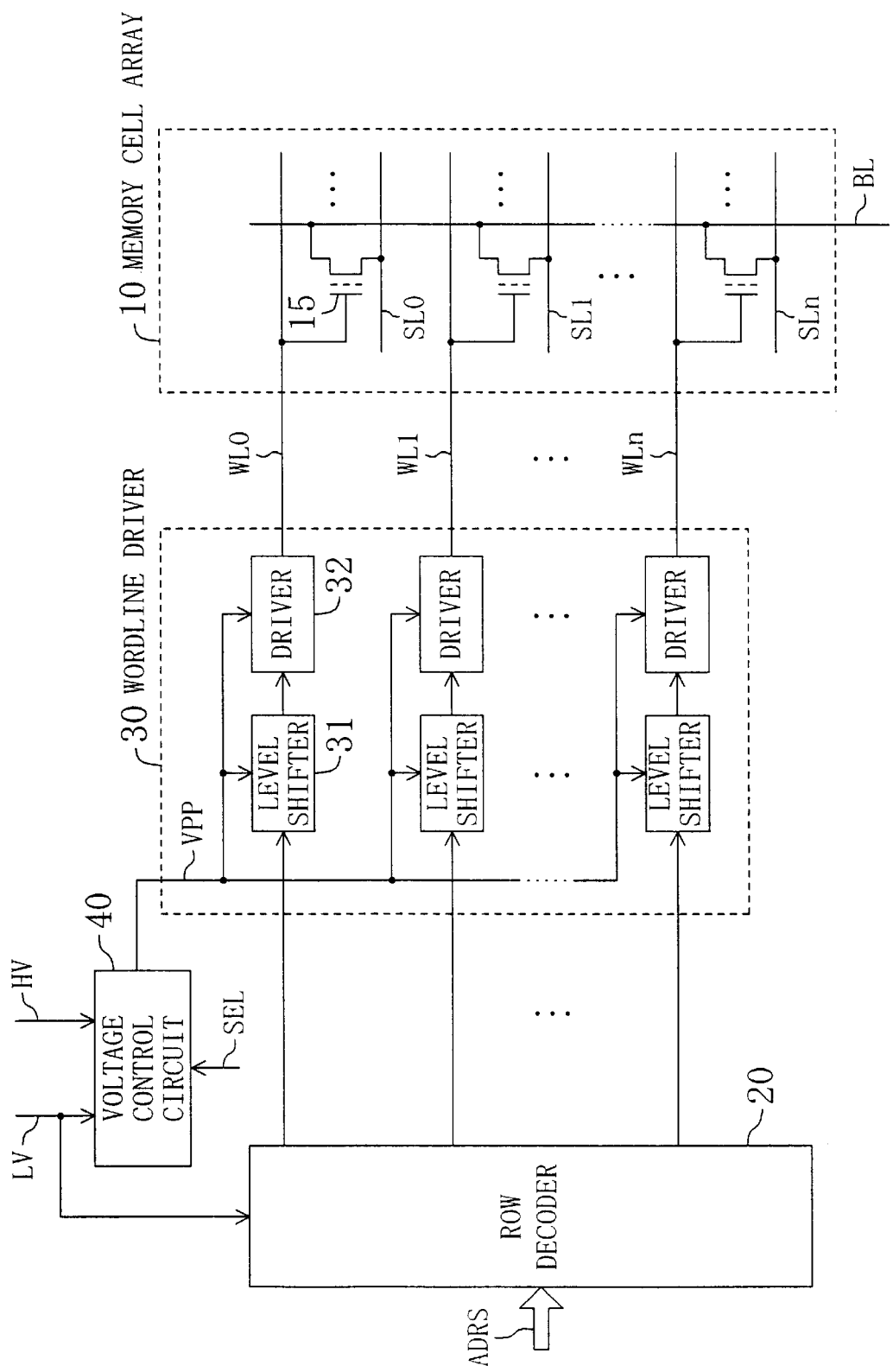
FIG. 2 is a block diagram showing an example of the configuration of a semiconductor integrated circuit according to the present invention.

Referring to FIG. 2, there is shown an exemplary configuration of a semiconductor integrated circuit according to the present invention. The semiconductor integrated circuit of FIG. 2 is a flash memory which includes a memory cell array 10, a row decoder 20, a wordline driver 30, and a voltage control circuit 40. The memory cell array 10 is made up of a large number of nonvolatile memory cells 15 of the floating gate type, each nonvolatile memory cell 15 having a control gate. In FIG. 2, WL0, WL1, . . . , WLn are wordlines. SL0, SL1, . . . , SLn are source lines. BL is a bitline. WL0, WL1, . . . , WLn are connected to the control gates of their corresponding nonvolatile memory cells 15. The wordline driver 30 comprises a level shifter 31 for converting an address decode signal into a signal at the level of a driver power supply voltage VPP controlled by the voltage control circuit 40 and a driver 32 for driving, in response to an output signal from the level shifter 31, a corresponding one of the wordlines WL0, WL1, . . . , WLn with the VPP-level logical signal. The row decoder 20 is a decoder for generating from an address (ADRS) signal an address decode signal to be supplied to each level shifter 31 for selection of a row in the memory cell array 10. The voltage control circuit 40 is a circuit for connecting, in response to a selection (SEL) signal, either one of a high voltage (HV) power supply and a low voltage (LV) power supply to a VPP feed line. Note that the power supply of the row decoder 20 is fixed at LV.

More concretely, the nonvolatile memory cell 15 is a cell of the channel hot electron (CHE) type and the writing of an information bit to the nonvolatile memory cell 15 is performed by application of 6 V to the control gate (see S. Ogura et al., "Low Voltage, Low Current, High Speed Program Step Split Gate Cell with Ballistic Direct Injection for EEPROM/Flash", IEDM 1998, pp. 987–990). Accordingly, for example, LV=3.3 V and HV=6 V. Further, the flash memory of FIG. 2 is used for storage of instruction codes and is mounted on the same semiconductor chip that the microcontroller is mounted. This type of memory is called "the code ROM" which is factory-programmed only once and can only be read thereafter. The cycle time of programming and erase ranges from several tens of microseconds to several hundreds of milliseconds, and the cycle time of read is about several tens of nanoseconds.

Figure 3:
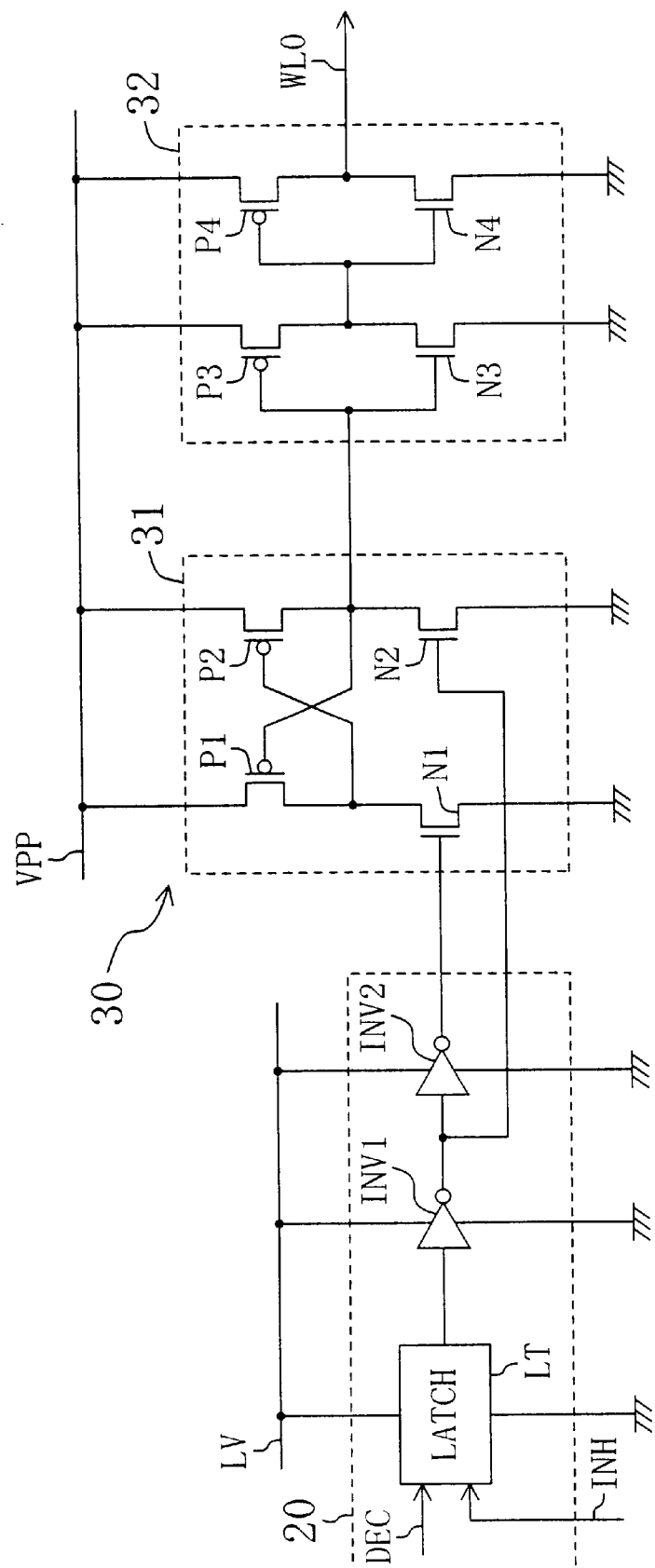
FIG. 3 is a circuit diagram showing in detail an example of the configuration of a wordline driver in FIG. 2.

FIG. 3 shows an exemplary detailed configuration of the wordline driver 30 in FIG. 2. The row decoder 20 has a latch LT for holding an address decode (DEC) signal and two inverters INV1 and INV2. The inverters INV1 and INV2 provide their respective outputs to the level shifter 31. The level shifter 31 is made up of two P channel MOS transistors P1 and P2 connected to VPP to form a latch and two N channel MOS transistors N1 and N2 placed on the ground side. The outputs of INV1 and INV2 are fed to the gate of N2 and to the gate of N1, respectively. The driver 32 is formed by a CMOS inverter 2-stage configuration made up of two P channel MOS transistors P3 and P4 connected to VPP and two N channel MOS transistors N3 and N4 placed on the ground side. The level shifter 31 and the driver 32 for each wordline WL0, WL1, . . . , WLn are each configured as shown in FIG. 3.

Figure 1:
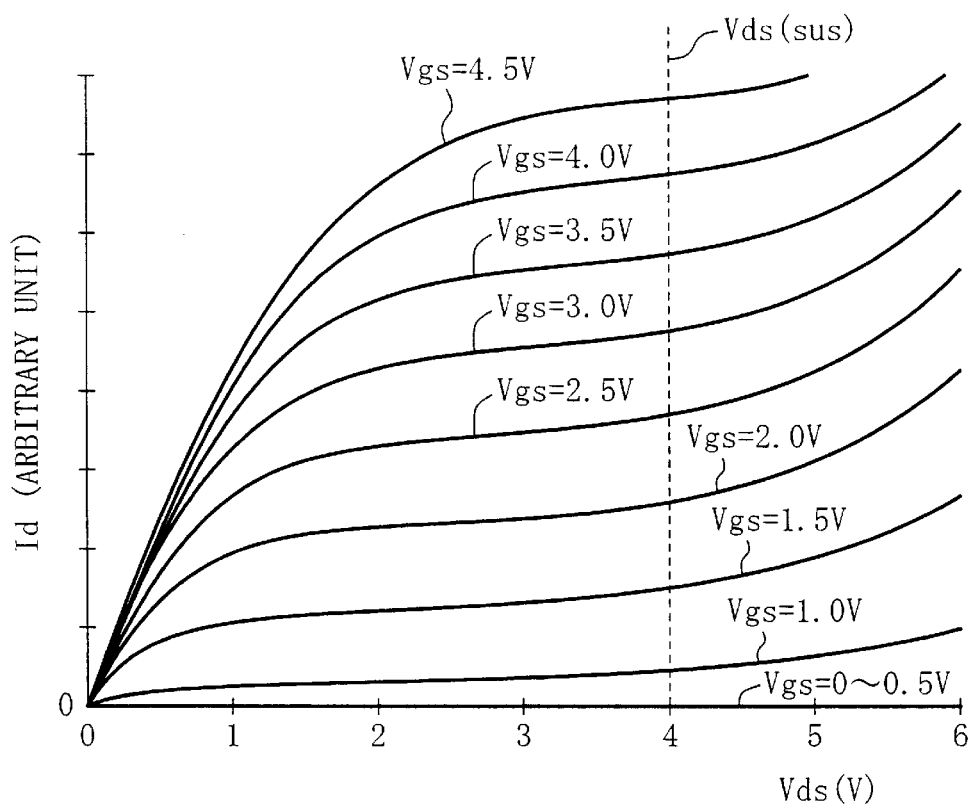
FIG. 1 is a transistor characteristic diagram for the purpose of providing a description of the sustaining voltage of an N channel MOS transistor.

Each of the eight MOS transistors P1–P4 and N1–N4 in FIG. 3 has a given sustaining voltage Vds(sus). Here, the transistors N1–N4 each have characteristics shown in FIG. 1, and the transistors P1–P4 each have P channel characteristics corresponding with FIG. 1. In the read mode of reading an information bit from the nonvolatile memory cell 15, the voltage control circuit 40 operates to hold VPP at the voltage LV below Vds(sus) so that WL0 is driven by P1–P4 and N1–N4 at a logical voltage below Vds(sus). On the other hand, in the write mode of writing an information bit into the nonvolatile memory cell 15 (i.e., the programming/erase mode), (a) the voltage control circuit 40 operates to hold VPP at the voltage LV below Vds(sus) when the logical state of P1–P4 and N1–N4 is changed, (b) after the logical state of P1–P4 and N1–N4 is changed, the voltage control circuit 40 operates to ramp up VPP from the voltage LV below Vds(sus) to the voltage HV above Vds(sus) so that WL0 can be driven by P1–P4 and N1–N4 at a logical voltage above Vds(sus), and (c) before the logical state of P1–P4 and N1–N4 is changed next, the voltage control circuit 40 operates to ramp down VPP from HV to LV. The state change inhibition (INH) signal applied to the latch LT forms means for inhibiting P1–P4 and N1–N4 from changing in logical state during the period that VPP is above Vds(sus). The position of the latch LT shown in the figure should not be deemed restrictive.

Figure 4:
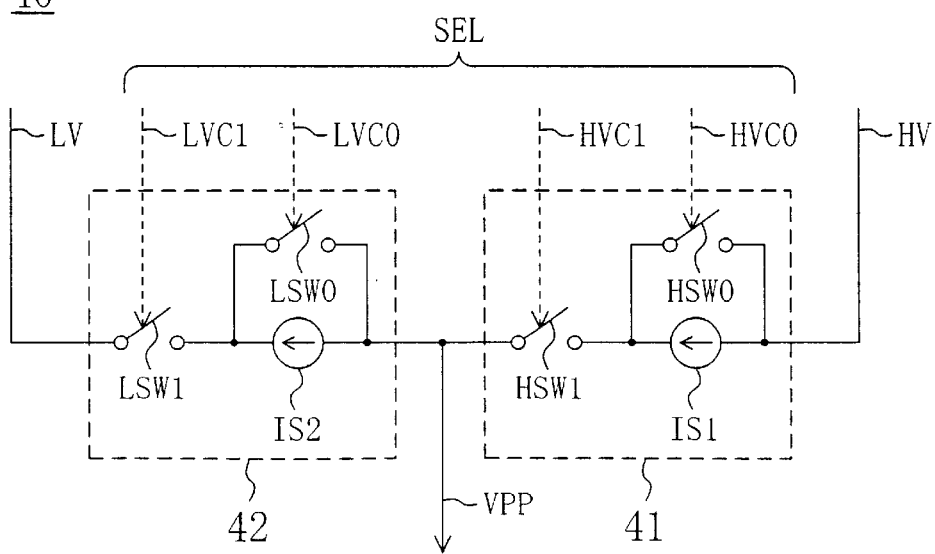
FIG. 4 is a circuit diagram showing in detail an example of the configuration of a voltage control circuit in FIG. 2.

FIG. 4 shows an exemplary detailed configuration of the voltage control circuit 40 in FIG. 2. The voltage control circuit 40 has an HV voltage supply for supplying the high voltage HV, a constant current source circuit IS1 interposed between the HV voltage supply and the VPP feed line, an LV voltage supply for supplying the low voltage LV, a constant current sink circuit IS2 interposed between the VPP feed line and the LV voltage supply, and a switch circuit made up of four switches HSW0, HSW1, LSW0, and LSW1. The SEL signal is composed of switch control signals HVC0, HVC1, LVC0, and LVC1 and these switch control signals are fed to HSW0, HSW1, LSW0, and LSW1, respectively. The switch circuit connects the VPP feed line directly to the LV voltage supply, with the HV voltage supply disconnected from the VPP feed line, for holding VPP at LV. Further, the switch circuit connects the HV voltage supply to the VPP feed line through IS1, with the VPP feed line disconnected from the LV voltage supply, for ramping up VPP. Furthermore, the switch circuit connects the HV voltage supply directly to the VPP feed line, with the VPP feed line disconnected from the LV voltage supply, for holding VPP at HV. Further, the switch circuit connects the VPP feed line to the LV voltage supply through IS2, with the HV voltage supply disconnected from the VPP feed line, for ramping down VPP. IS1, HSW0, and HSW1 together form a VPP ramp up circuit 41, whereas IS2, LSW0, and LSW1 together form a VPP ramp down circuit 42.

Figure 5:
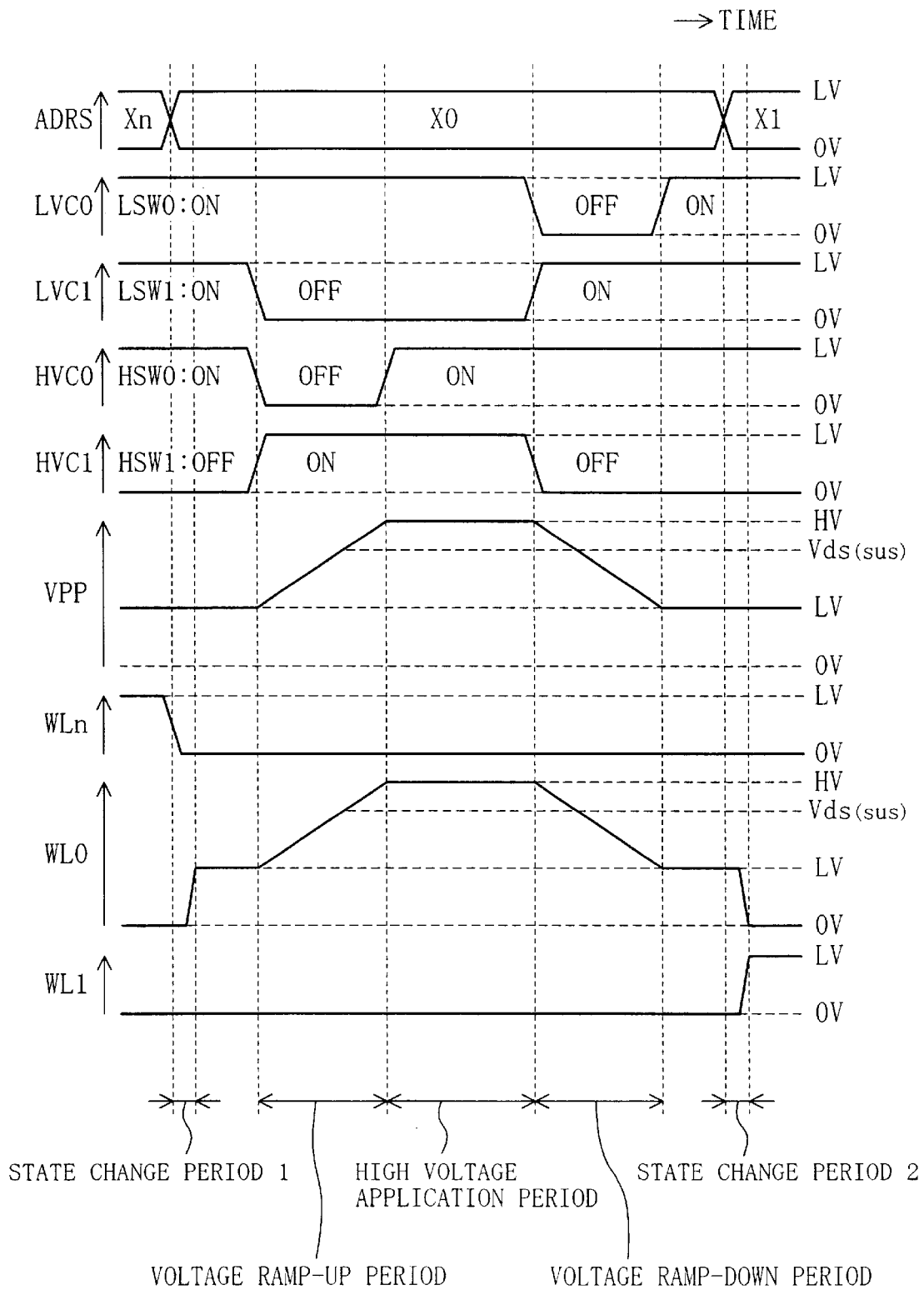
FIG. 5 is a time chart diagram showing an example of voltage waveforms in the semiconductor integrated circuit of FIG. 2.

FIG. 5 shows an example of voltage waveforms in the flash memory of FIG. 2. In this example, the ADRS signal changes from Xn to X0, and then to X1. Xn designates WLn. X0 designates WL0. X1 designates WL1. Hereinafter, operations of writing information bits onto a row designated by X0 will be explained sequentially in time.

(1) State Change Period 1

During this period, LSW0, LSW1, and HSW0 assume the on state and HSW1 assumes the off state. In other words, the VPP feed line is disconnected from the HV voltage supply, but it is connected directly to the LV voltage supply. Therefore, VPP=LV. At this time, when the ADRS signal changes from Xn to X0, the voltage of WLn changes from LV to 0 V and the voltage of WL0 changes from 0 V to LV. At this time, all the logical states of P1–P4 and N1–N4 relating to WL0 shown in FIG. 3 are reversed. However, since VPP is held at the voltage LV below Vds(sus), no reliability problem occurs at all. Here, the logical state of each of P1, P3, N2, and N4 is determined to be "off", and the state of each of P2, P4, N1, and N3 is determined to be "on".

(2) Voltage Ramp-Up Period

During this period, LSW0 and HSW1 assume the on state and LSW1 and HSW0 assume the off state. In other words, the VPP feed line is disconnected from the LV voltage supply, but it is connected to the HV voltage supply through IS1. Therefore, VPP gradually ramps up from LV to HV, so does the voltage of WL0. Since the logical state of each of P1–P4 and N1–N4 has already been determined, no avalanche breakdown will occur even when VPP increases beyond Vds(sus), as explained above. However, charging current flows in each of P2, P4, N1, and N3 in the on state due to the ramping-up of VPP. For example, if a large charging current flows through P2 to cause the drain-source voltage of P2 to go beyond the threshold voltage of P3, then P3 is no longer able to remain in the off state. Likewise, if a large charging current flows through N3 to cause the drain-source voltage of N3 to go beyond the threshold voltage of N4, then N4 is no longer able to remain in the off state. Therefore, the rate at which VPP ramps up is limited by current value control of IS1 so that the change in drain-source voltage of each transistor due to the VPP ramping-up will not change the logical state of transistors at the next stage.

(3) High Voltage Application Period

During this period, LSW0, HSW0, and HSW1 assume the on state and LSW1 assumes the off state. In other words, the VPP feed line is disconnected from the LV voltage supply, but it is connected directly to the HV voltage supply. Therefore, VPP=HV, which allows programming of the nonvolatile memory cell 15. The length of the high voltage application period ranges, as mentioned above, from several tens of microseconds to several hundreds of milliseconds.

(4) Voltage Ramp-Down Period

During this period, LSW1 and HSW0 assume the on state and LSW0 and HSW1 assume the off state. In other words, the VPP feed line is disconnected from the HV voltage supply, but it is connected to the LV voltage supply through IS2. Therefore, VPP gradually ramps down from HV to LV, so does the voltage of WL0. During such VPP ramping down, no avalanche breakdown will occur at all in any one of P1–P4 and N1–N4. However, discharge current flows in each of P2, P4, N1, and N3 in the on state due to the VPP ramping down. For example, if a large discharge current flows in P2 to cause P2 to change in drain potential and if such a drain potential change causes the difference between the drain potential and the well potential of P2 to exceed the built-in voltage of P2, this will result in turning on a parasitic bipolar of P2. Further, if a large discharge current flows in N3 to cause N3 to change in drain potential and if such a drain potential change causes the difference between the well potential and the drain potential of N3 to exceed the built-in voltage of N3, this will result in turning on a parasitic bipolar of N3. Therefore, the rate at which VPP ramps down is so limited by current value control of IS2 that the change in drain potential of a transistor due to the VPP ramping down will not turn on a parasitic bipolar of the transistor. As a result of such arrangement, it is possible to ramp down VPP without generating a latch-up trigger.

(5) State Change Period 2

During this period, like the above-described state change period 1, LSW0, LSW1, and HSW0 assume the on state and HSW1 assumes the off state. In other words, the VPP feed line is disconnected from the HV voltage supply, but it is connected directly to the LV voltage supply. Therefore, VPP=LV. At this time, when the ADRS signal changes from X0 to X1, the voltage of WL0 changes from LV to 0 V and the voltage of WL1 changes from 0 V to LV. At this time, all the logical states of P1–P4 and N1–N4 relating to WL0 shown in FIG. 3 are reversed. However, since VPP is held at the voltage LV below Vds(sus), no reliability problem occurs.

As described above, the MOS transistors (P1–P4 and N1–N4) of the high performance/low voltage specification suitable for wordline driving in the read mode are employed in the flash memory of FIG. 2 and, in addition, it is possible to cope with high voltage wordline driving in the programming/erase mode with no sacrifice in its performance. Further, by virtue of the INH signal to the latch LT, it is guaranteed that avalanche breakdown is inhibited. However, high voltage wordline driving inevitably becomes slow, in view of which the flash memory of the present invention is suitable for code ROMs.

Figure 6:
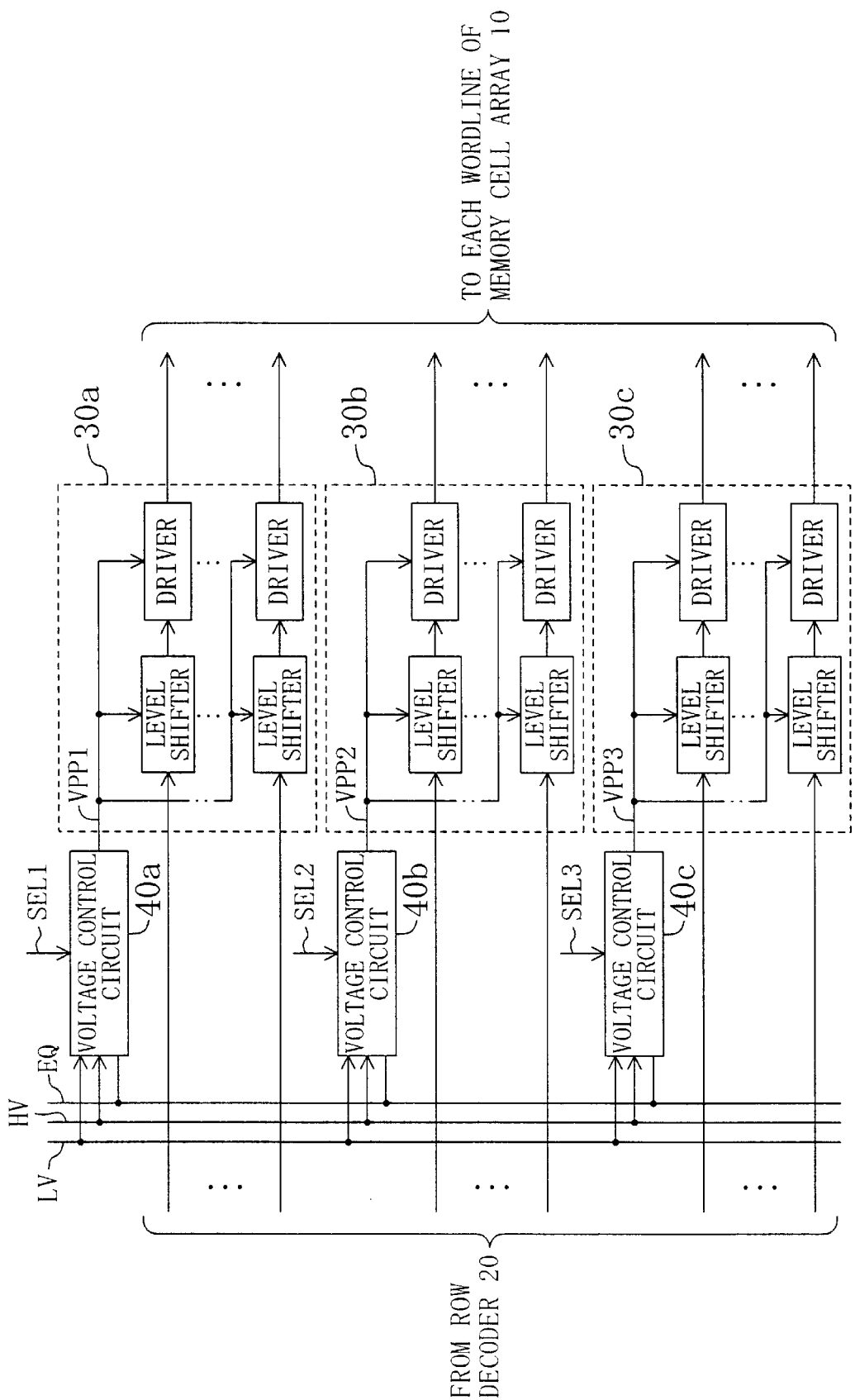
FIG. 6 is a block diagram showing a variation of the semiconductor integrated circuit of FIG. 2.

FIG. 6 shows a variation of FIG. 2. In the flash memory of FIG. 6, the wordline driver is divided into a plurality of wordline drivers and the plurality of wordline drivers are provided with their respective voltage control circuits, in order to reduce the burden of each voltage control circuit. FIG. 6 shows three wordline drivers 30a, 30b, and 30c and three voltage control circuits 40a, 40b, and 40c for supplying individual power supply voltages VPP1, VPP2, and VPP3 to the wordline drivers 30a, 30b, and 30c, respectively. SEL1, SEL2, and SEL3 of FIG. 6 are selection signals that are sent to the voltage control circuits 40a, 40b, and 40c, respectively. EQ is an power supply equalization line for connecting together feed lines of two of the individual power supply voltages (for example, VPP1 and VPP2) so that VPP2 is ramped up while VPP1 is ramped down. EQ is connected neither to HV nor to LV. Each voltage control circuit 40a, 40b, and 40c can be implemented by addition of components such a switches to the configuration of FIG. 4.

Figure 7:
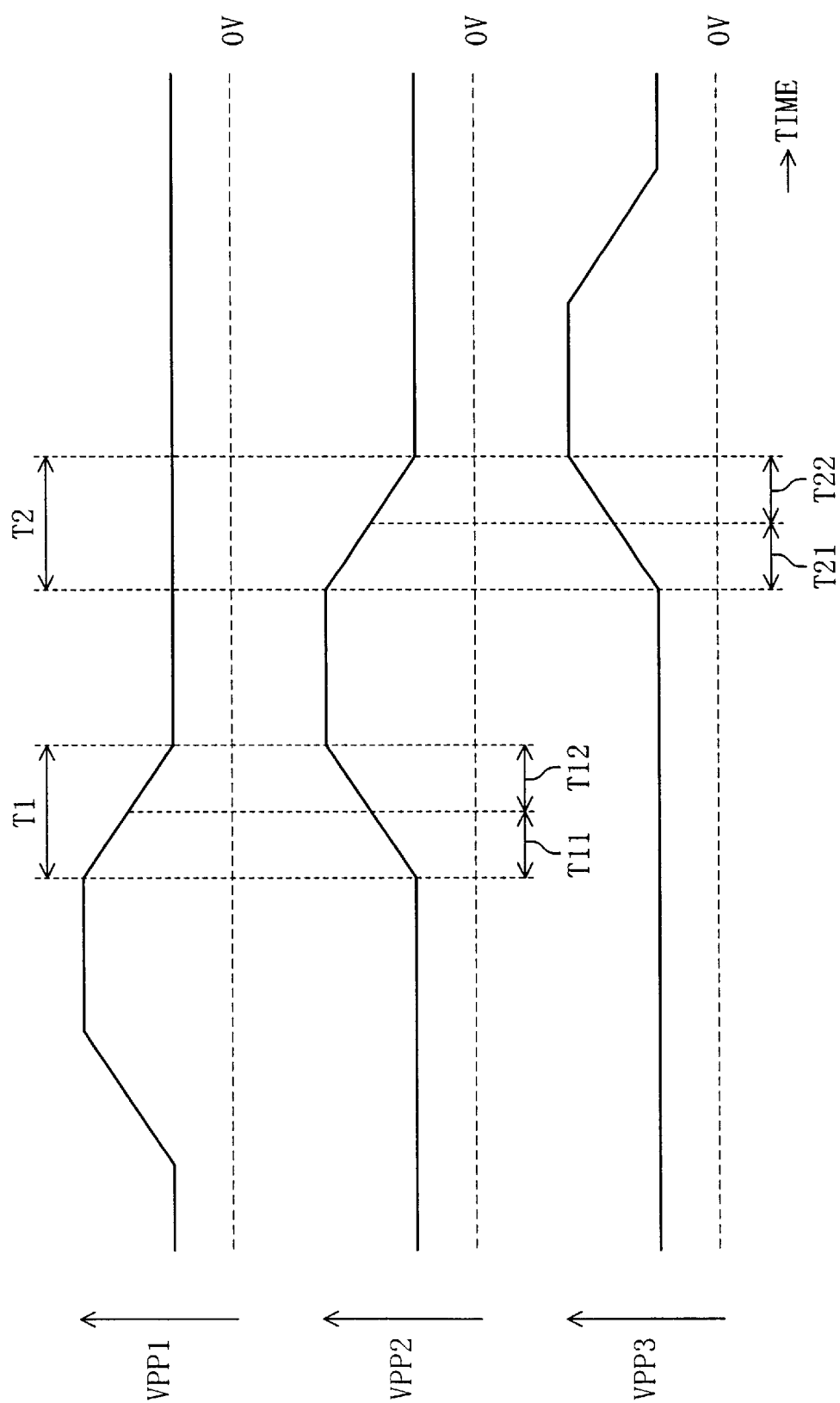
FIG. 7 is a time chart diagram showing an example of waveforms of power supply voltages in FIG. 6.

FIG. 7 shows an example of waveforms of the individual power supply voltages VPP1, VPP2, and VPP3 in FIG. 6. According to FIG. 7, in a first half portion T11 of a period T1, VPP1>VPP2. Therefore, the ramping down of VPP1 and the ramping up of VPP2 can be accomplished, just by connecting together the feed lines of VPP1 and VPP2 by the power supply equalization line EQ. That is, the recycling of charges stored in the feed line of VPP1 can be accomplished and consumption power is reduced. However, in a second half portion T12 of the period T1, the feed line of VPP1 is connected to LV, whereas the feed line of VPP2 is connected to HV. Likewise, in a first half portion T21 of a second period T2, the feed line of VPP2 and the feed line of VPP3 are connected together through the power supply equalization line EQ and in a second half portion T22 of the second period T2, the feed line of VPP2 is connected to LV, whereas the feed line of VPP3 is connected to HV.

The circuit technology of the present invention is applicable not only to flash memories, but it is extensively applicable also to other types of semiconductor integrated circuits. Further, the applicability of the circuit technology of the present invention is not limited to MOS transistors. The circuit technology of the present invention is applicable also to circuits made up of, for example, bipolar transistors.

What is claimed is:

1. A semiconductor integrated circuit comprising:

a transistor having a sustaining voltage; and a voltage control circuit for controlling a power supply voltage coupled to a source-drain path of said transistor;

wherein said voltage control circuit operates to hold said power supply voltage a voltage level below said sustaining voltage when a logical state of said transistor is changed, and operates to ramp up said power supply voltage from said voltage level below said sustaining voltage to a voltage level above said sustaining voltage after the logical state of said transistor has been changed, and wherein when said transistor assumes an on state, said voltage control circuit further operates to limit the rate at which said power supply voltage ramps up so that the logical state of a next-stage transistor of said transistor is not changed by a change in the drain-source voltage of said transistor due to the ramping up of said power supply voltage.

2. The semiconductor integrated circuit of claim 1, wherein said transistor is a MOS transistor.

3. The semiconductor integrated circuit of claim 1, wherein said power supply voltage is coupled to a source-drain path of said next-stage transistor.

4. A semiconductor integrated circuit comprising:

a MOS transistor having a sustaining voltage; and a voltage control circuit for controlling a power supply voltage coupled to a source-drain path of said transistor;

wherein said voltage control circuit operates to hold said power supply voltage at a voltage level below said sustaining voltage when a logical state of said transistor is changed, and operates to ramp up said power supply voltage from said voltage level below said sustaining voltage to a voltage level above said sustaining voltage after the logical state of said transistor has been changed, wherein when said MOS transistor assumes an on state, said voltage control circuit further operates to limit the rate at which said power supply voltage ramps down so that a parasitic bipolar of said MOS transistor is not turned on by a change in the drain potential of said MOS transistor due to the ramping down of said power supply.

5. A semiconductor integrated circuit comprising:

a transistor having a sustaining voltage; and a voltage control circuit for controlling a power supply voltage coupled to said transistor;

wherein said voltage control circuit operates to hold said power supply voltage at a voltage level below said sustaining voltage when the logical state of said transistor is changed, and operates to ramp up said power supply voltage from said voltage level below said sustaining voltage to a voltage level above said sustaining voltage after the logical state of said transistor has been changed, and wherein before the logical state of said transistor is changed next, said voltage control circuit further operates to ramp down said power supply voltage from said voltage level above said sustaining voltage to said voltage level below said sustaining voltage;

said voltage control circuit including:

a first constant voltage supply for supplying a voltage above said sustaining voltage;

a constant current source circuit interposed between said first constant voltage supply and a feed line of said power supply voltage; a second constant voltage supply for supplying a voltage below said sustaining voltage;

a constant current sink circuit interposed between said feed line of said power supply voltage and said second constant voltage supply; and switch means for:

(a) connecting said feed line of said power supply voltage directly to said second constant voltage supply, with said first constant voltage supply disconnected from said feed line of said power supply voltage, for holding said power supply voltage at a voltage level below said sustaining voltage;

(b) connecting said first constant voltage supply to said feed line of said power supply voltage through said constant current source circuit, with said feed line of said power supply voltage disconnected from said second constant voltage supply, for ramping up said power supply voltage;

(c) connecting said first constant voltage supply directly to said feed line of said power supply voltage, with said feed line of said power supply voltage disconnected from said second constant voltage supply, for holding said power supply voltage at a voltage level above said sustaining voltage; and (d) connecting said feed line of said power supply voltage to said second constant voltage supply through said constant current sink circuit, with said first constant voltage supply disconnected from said feed line of said power supply voltage, for ramping down said power supply voltage.

6. A semiconductor integrated circuit comprising:

a transistor having a sustaining voltage; and a voltage control circuit for controlling a power supply voltage coupled to said transistor;

means for inhibiting said transistor from changing in its logical state during the period that said power supply voltage is higher than said sustaining voltage; and wherein said voltage control circuit operates to hold said power supply voltage at a voltage level below said sustaining voltage when the logical state of said transistor is changed, and operates to ramp up said power supply voltage from said voltage level below said sustaining voltage to a voltage level above said sustaining voltage after the logical state of said transistor has been changed.

7. A semiconductor integrated circuit comprising:

a plurality of circuit blocks, each of said plural circuit blocks including a MOS transistor having a sustaining voltage; and a plurality of voltage control circuits, each of said plural voltage control circuits being operable to control an individual power supply voltage coupled to a source-drain path of said MOS transistor in a corresponding one of said plural circuit blocks;

wherein:

said voltage control circuit operates to hold said individual power supply voltage at a voltage level below said sustaining voltage when the logical state of said MOS transistor in said corresponding circuit block is changed, and operates to ramp up said individual power supply voltage from said voltage level below said sustaining voltage to a voltage level above said sustaining voltage after the logical state of said MOS transistor has been changed; and said voltage control circuit operates to ramp down said individual power supply voltage from said voltage level above said sustaining voltage to said voltage level below said sustaining voltage before the logical state of said MOS transistor in said corresponding circuit block is changed next, said semiconductor integrated circuit further comprising a power supply equalization line for connecting together feed lines of individual power supply voltages so that one of said individual power supply voltages is ramped down while the other individual power supply voltage is ramped up.

8. A semiconductor integrated circuit comprising:

a floating gate type nonvolatile memory cell having a control gate;

a wordline connected to said control gate;

a wordline driver having a MOS transistor for driving said wordline; and a voltage control circuit for controlling a power supply voltage coupled to a source-drain path of said MOS transistor;

wherein said MOS transistor has a sustaining voltage; and wherein in a mode of reading an information bit from said nonvolatile memory cell, said voltage control circuit operates to hold said power supply voltage at a voltage level below said sustaining voltage so that said MOS transistor drives said wordline at a voltage level below said sustaining voltage; and wherein in a mode of writing an information bit into said nonvolatile memory cell, said voltage control circuit operates to hold said power supply voltage at said voltage level below said sustaining voltage when the logical state of said MOS transistor is changed, and operates to ramp up said power supply voltage from said voltage level below said sustaining voltage to a voltage level above said sustaining voltage so that said MOS transistor drives said wordline at a voltage level above said sustaining voltage after the logical state of said MOS transistor has been changed, and wherein when said MOS transistor assumes an on state, said voltage control circuit further operates to limit the rate at which said power supply voltage ramps up so that the logical state of a next-stage transistor of said MOS transistor is not changed by a change in the drain-source voltage of said MOS transistor due to the ramping up of said power supply voltage.

9. The semiconductor integrated circuit of claim 8, wherein said voltage control circuit further operates to ramp down said power supply voltage from said voltage level above said sustaining voltage to said voltage level below said sustaining voltage before the logical state of said MOS transistor is changed next.

10. The semiconductor integrated circuit of claim 8, wherein said wordline driver includes:

a level shifter for converting an address decode signal having a voltage level below said sustaining voltage into a signal at a power supply voltage level controlled by said voltage control circuit; and a driver for driving said wordline at said power supply voltage level in response to an output signal from said level shifter.

11. A semiconductor integrated circuit comprising:

a transistor having a sustaining voltage;

a circuit for controlling a logical state of said transistor;

a voltage control circuit for controlling a power supply voltage coupled to a source-drain path of said transistor in response to a control signal, said voltage control circuit being operative to ramp up said power supply voltage from a voltage level below said sustaining voltage to a voltage level above said sustaining voltage, to ramp down said power supply voltage from a voltage level above said sustaining voltage to a voltage level below said sustaining voltage, and to hold said power supply voltage level below said sustaining voltage when a logical state of said transistor changes, and a means, coupled to said circuit for controlling a logical state, for inhibiting changes in a logical state of said transistor when said power supply voltage is above said sustaining voltage.

* * * * *